United States Patent [19]

Kvaternik

[11] Patent Number: 4,510,445

[45] Date of Patent: Apr. 9, 1985

[54] MINIATURE CIRCUIT PROCESSING DEVICES AND MATRIX TEST HEADS FOR USE THEREIN

[76] Inventor: Joseph Kvaternik, 19366 McCourtney, Grass Valley, Calif. 95945

[21] Appl. No.: 317,413

[22] Filed: Nov. 2, 1981

[51] Int. Cl.³ .................. G01R 31/02; G01R 1/06
[52] U.S. Cl. ................ 324/158 F; 324/158 P
[58] Field of Search ............ 324/158 F, 158 P, 72.5

[56] References Cited

U.S. PATENT DOCUMENTS

| | | | |
|---|---|---|---|
| 3,185,927 | 5/1965 | Margulis et al. | 324/158 P |
| 3,334,354 | 8/1967 | Mutschler | 346/140 |
| 3,345,567 | 10/1967 | Turner et al. | 324/158 P |
| 3,437,929 | 4/1969 | Glenn | 324/158 F |
| 3,600,057 | 8/1971 | Leffler | 350/81 |
| 3,731,191 | 5/1973 | Bullard et al. | 324/158 P |
| 3,768,351 | 10/1973 | Stepan | 83/55 |
| 3,930,809 | 1/1976 | Evans | 29/203 J |
| 4,035,723 | 7/1977 | Kvaternik | 324/158 P |
| 4,052,793 | 10/1977 | Coughlin et al. | 33/180 R |

OTHER PUBLICATIONS

IBM Technical Disclosure Bulletin 562000032 Y, Betts et al., vol. 18, No. 9, 2/1976.
Model 1034 Automatic Wafer Prober, Electroglas, Menlo Park, Calif.

Primary Examiner—Ernest F. Karlsen
Attorney, Agent, or Firm—Claude A. S. Hamrick

[57] ABSTRACT

A matrix test head for miniature circuits is disclosed which consists of a number of rigidly mounted printed circuit boards supporting a plurality of contact probes for contacting test points of miniature circuits.

11 Claims, 22 Drawing Figures

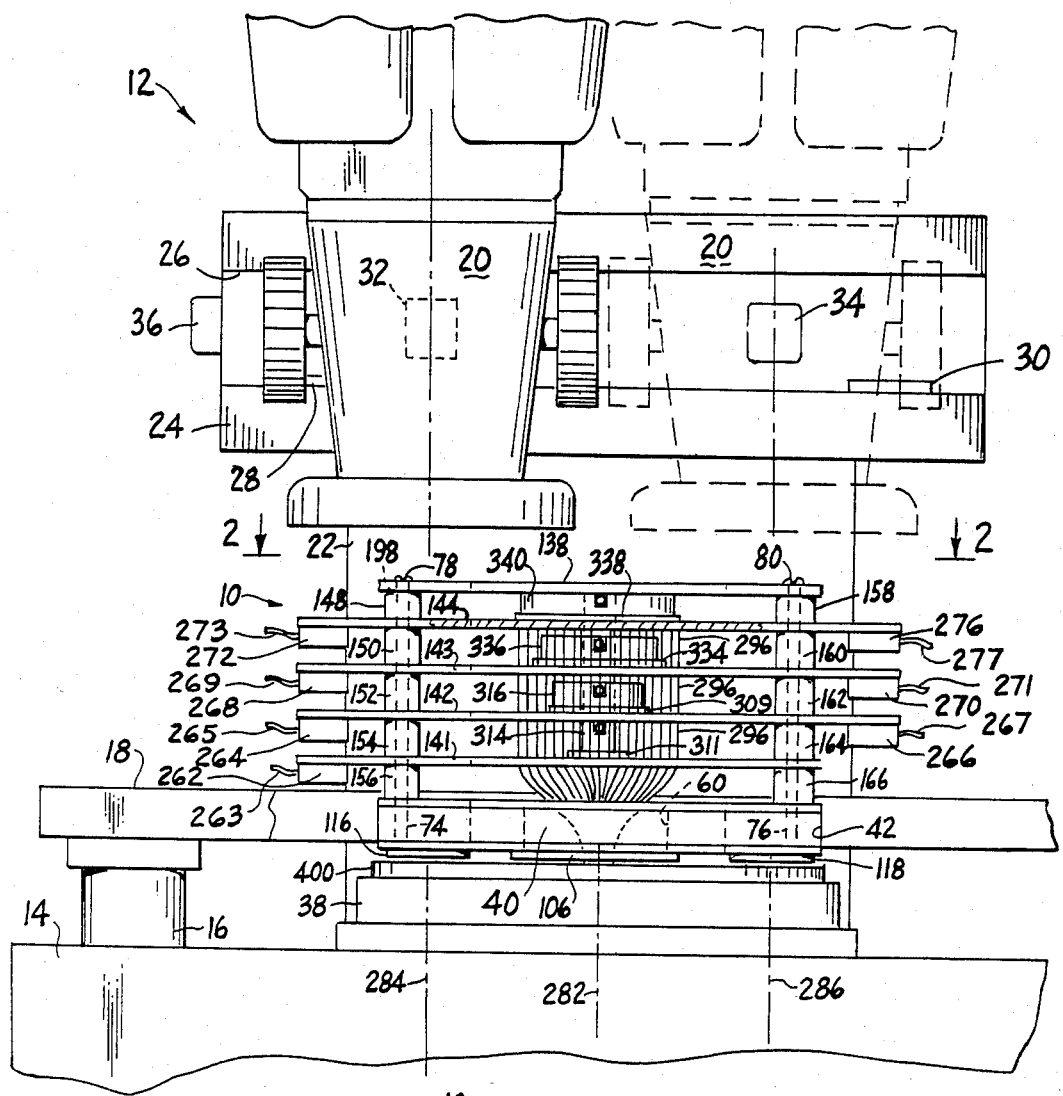
FIG_1.
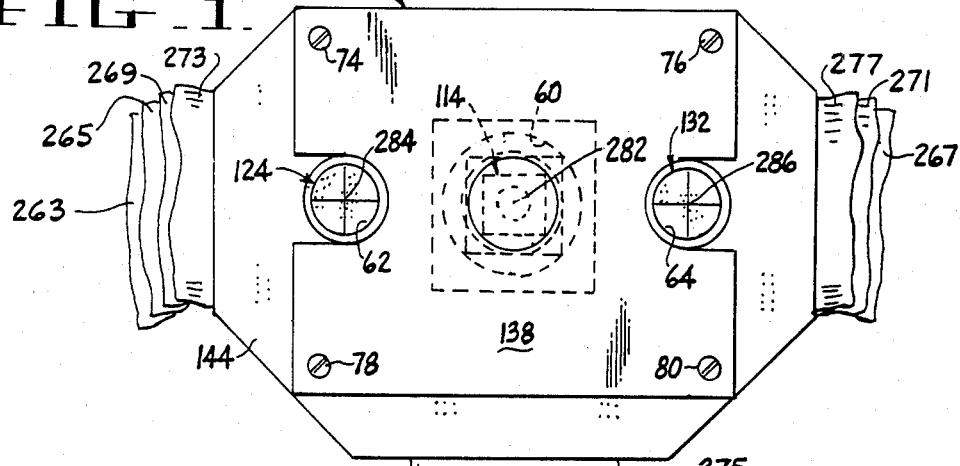
FIG_2.

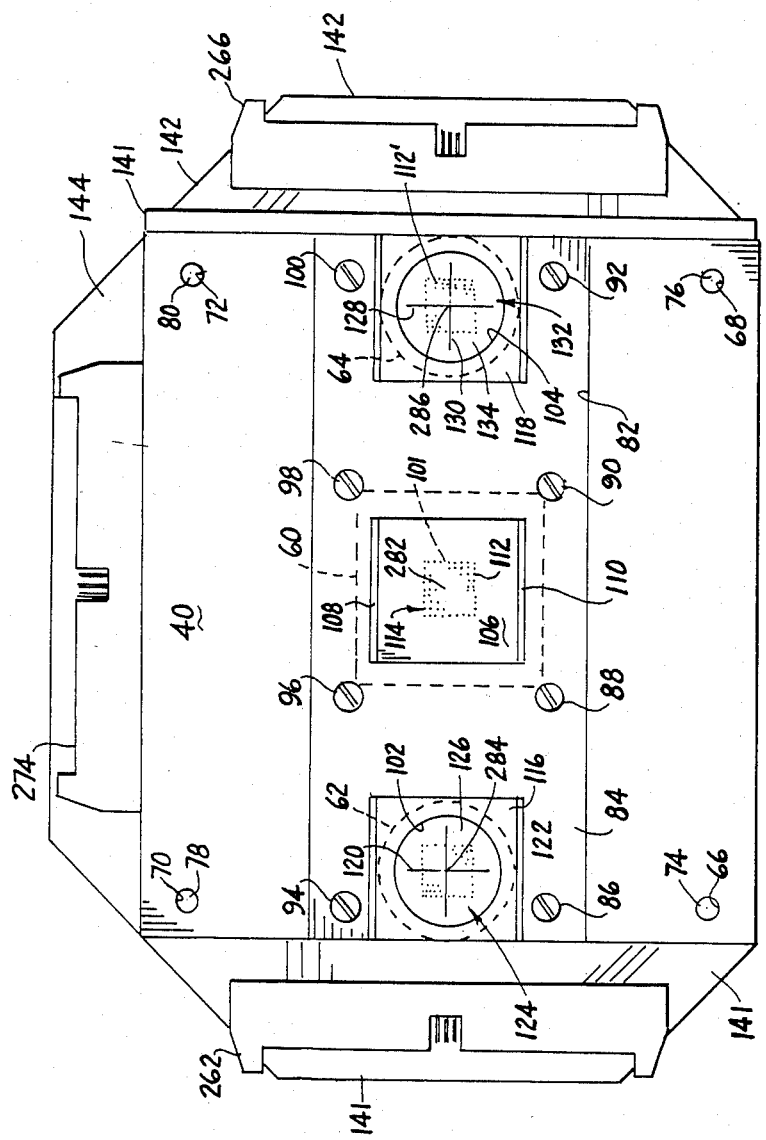

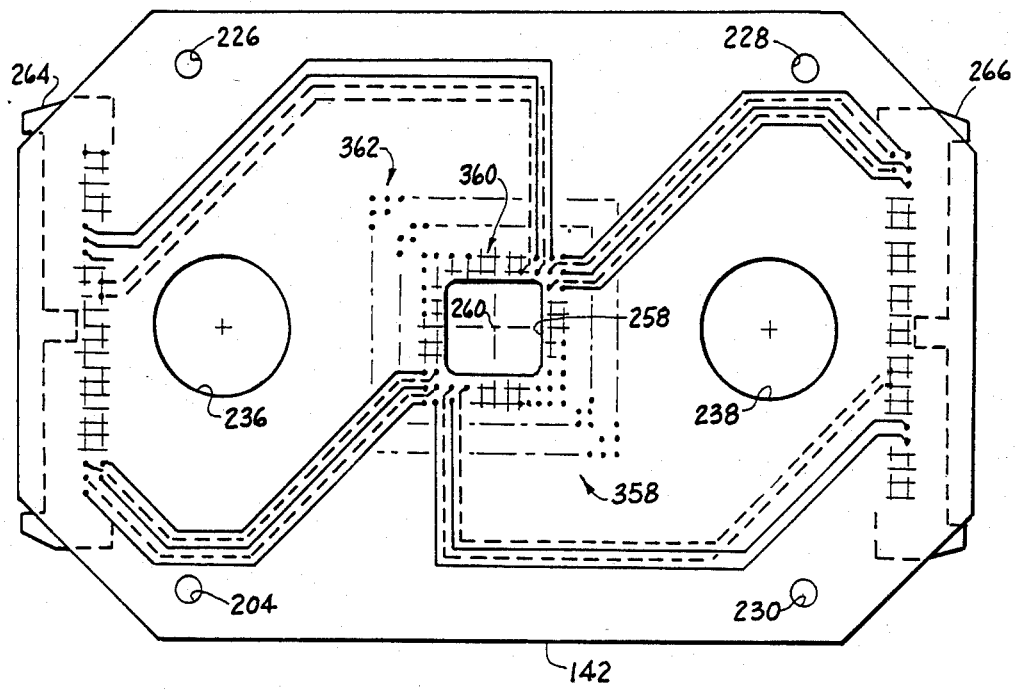
FIG_6_
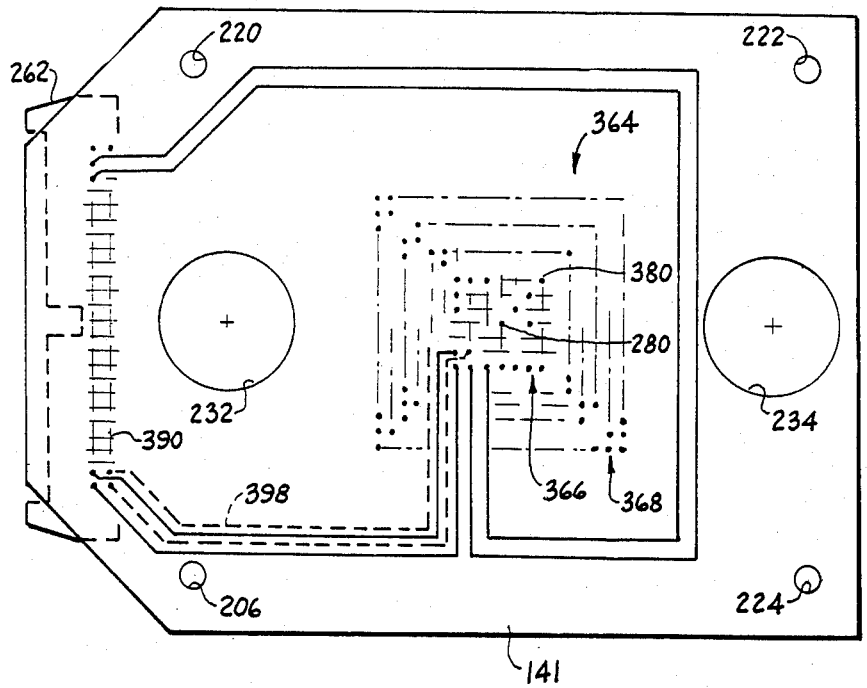
FIG_7_

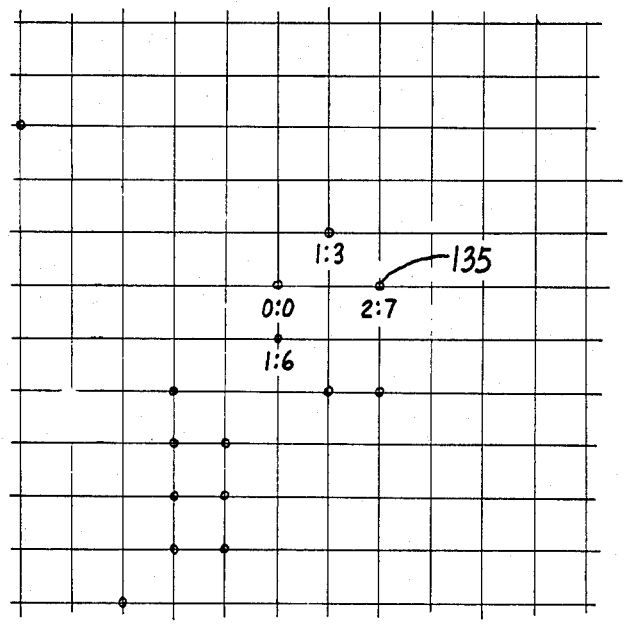
FIG_8A_
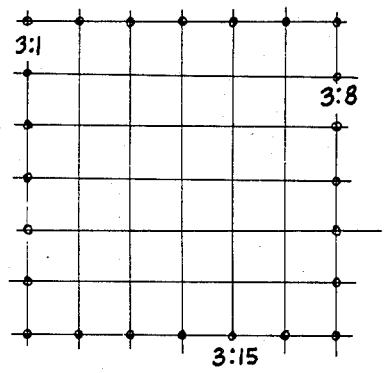
FIG_8B_
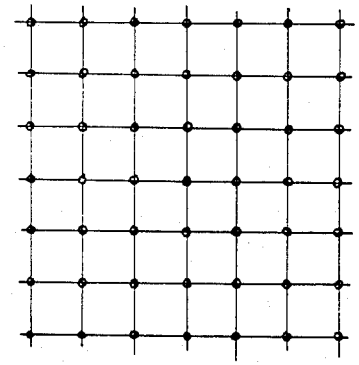
FIG_8C_

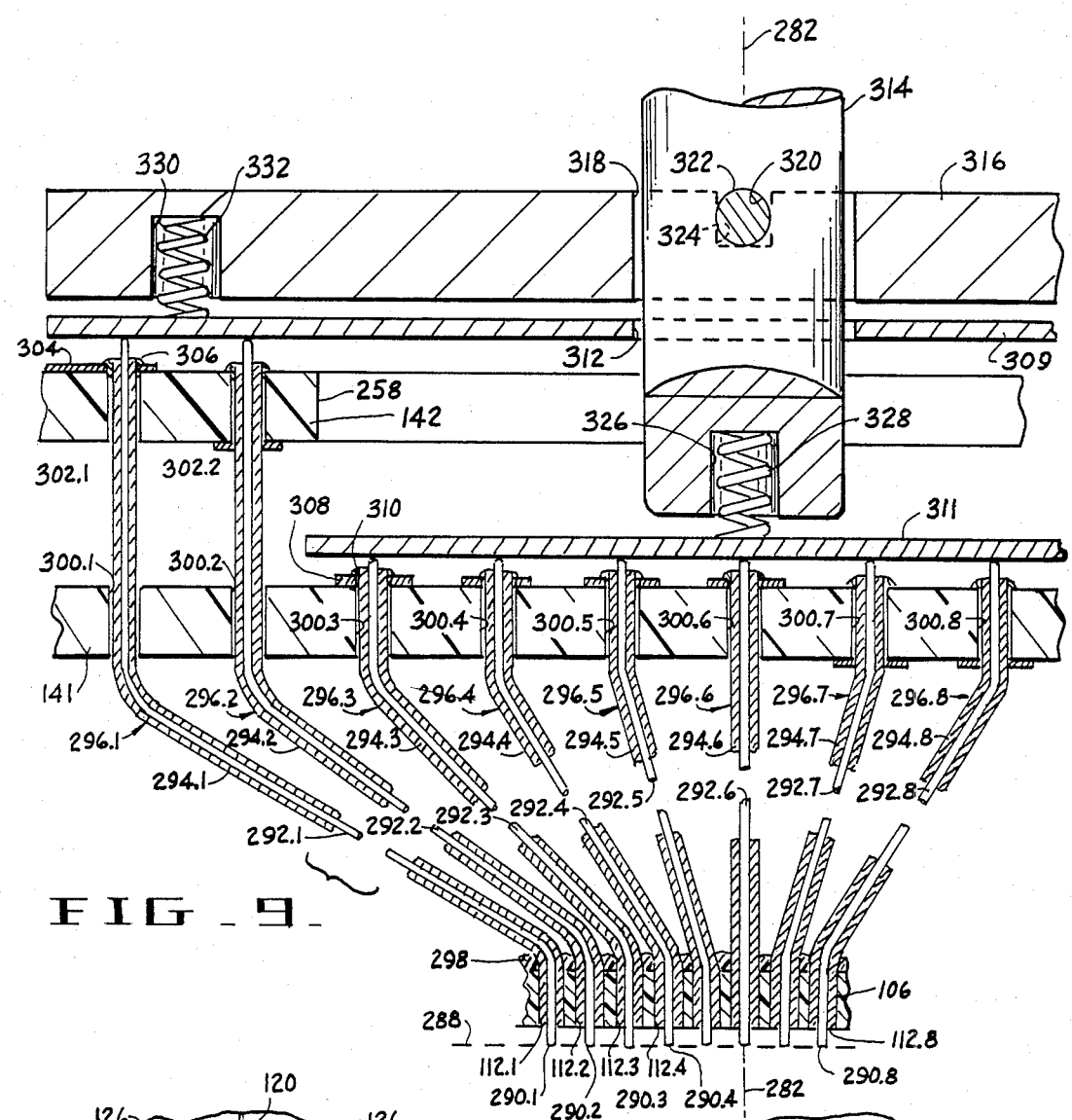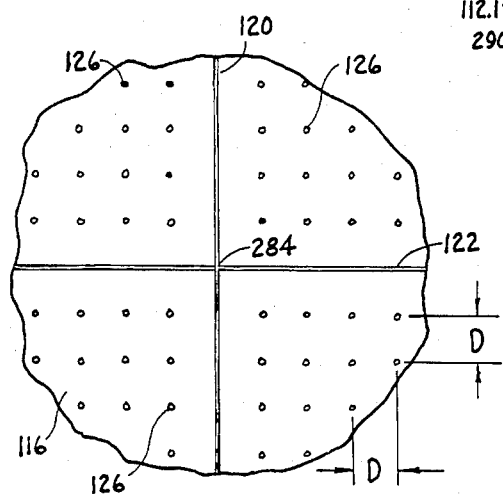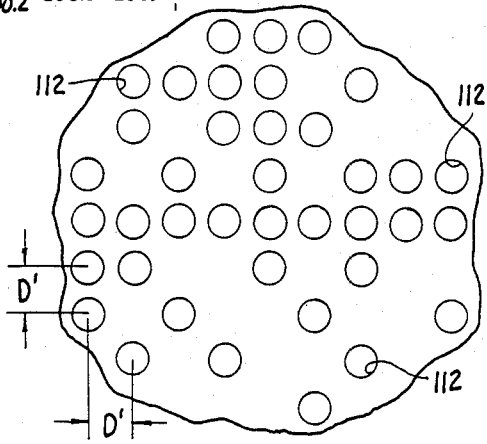

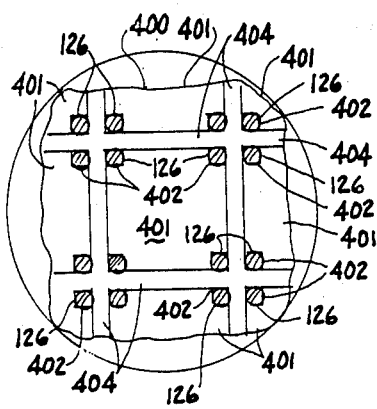
FIG_12C.
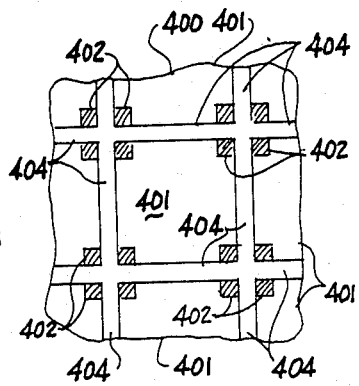
FIG_12B.
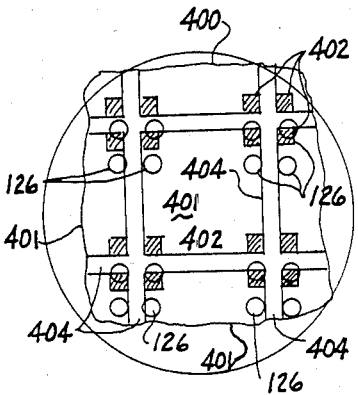
FIG_12A.
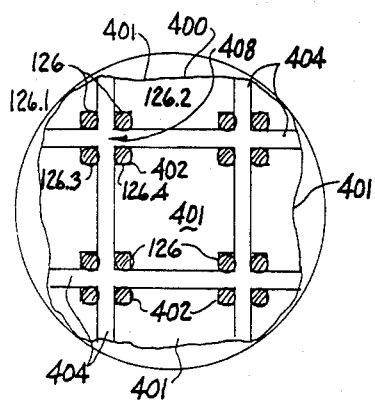
FIG_12F
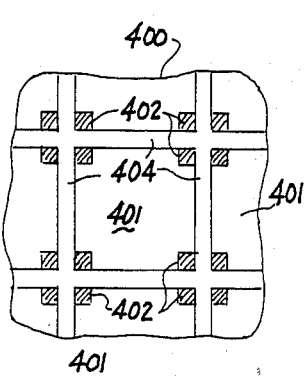
FIG_12E
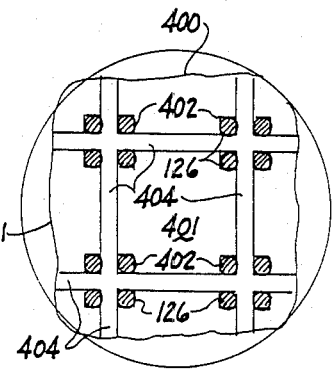
FIG_12D
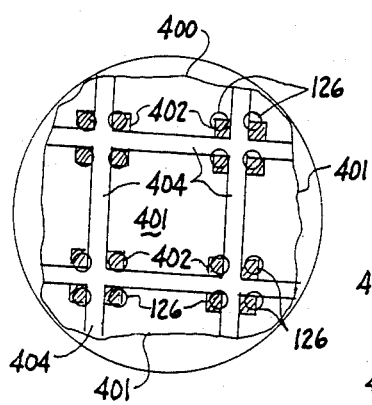
FIG_12I
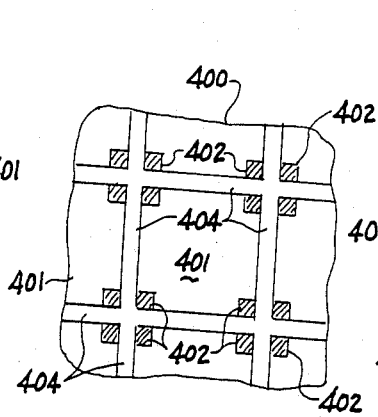
FIG_12H
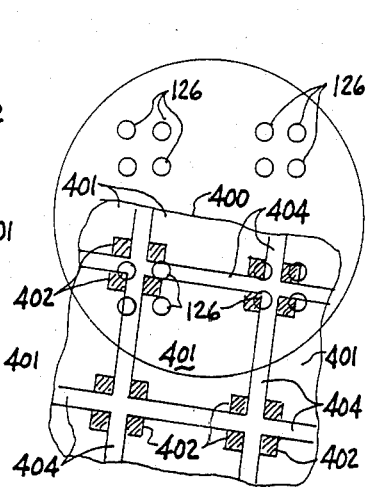
FIG_12G

MINIATURE CIRCUIT PROCESSING DEVICES AND MATRIX TEST HEADS FOR USE THEREIN

BACKGROUND OF THE INVENTION

1. Field of the Invention

My present invention relates to miniature circuit processing devices, such as integrated circuit wafer probers, and to test or contact heads for use therein.

2. Description of the Prior Art

The term "prior art" as used herein, or in any statement made by or for applicant, means *only* that any document or thing referred to as prior art bears, directly or inferentially, a date that is earlier than the effective filing date hereof. Miniature circuit processing devices and test heads for use in the same are known in the prior art. Among such miniature circuit processing devices is the Model 1034 wafer prober made and sold by Electroglas, Inc., of Menlo Park, Calif. Test heads for use in such devices, called "probe cards" in the prior art, and methods of making the same, are shown and described in U.S. Pat. No. 3,930,809, issued to Arthur Evans on Jan. 6, 1976. A method of obtaining proper probe alignment in a multiple contact environment is shown and described in U.S. Pat. No. 4,052,793, issued to Coughlin, et al., on Oct. 11, 1977. Probe means for use on such probe cards are shown and described in my U.S. Pat. No. 4,035,723, issued on July 12, 1977.

Such prior art miniature circuit processing devices and probe cards therefor, however, generally provide only a very limited number of test probes, the majority of which test probes are arrayed in a ring-shaped array.

While the limited number and relative disposition of the test probes of these prior art test heads is convenient, in that the miniature circuit processing device operator can position the probes on the surface of the miniature circuit to be tested by direct vision, i.e., through a microscope which is part of the processing device, the limited number of probes available in these prior art miniature circuit processing devices renders them inconvenient or indeed unfit for use in testing certain miniature circuits, such as monolithic integrated circuits and hybrid integrated circuits, in which the test points to be contacted are arrayed quite densely over a very small area, rather than being disposed in a ring-shaped array.

It is believed that the prior art documents listed hereinabove contain information which is or might be considered to be material to the examination of this patent application. However, no representation or admission is made that any of the above-cited documents is part of the prior art except in the sense in which the term prior art is defined hereinabove, or that no more pertinent information exists.

SUMMARY OF THE INVENTION

Accordingly, it is an object of my invention to provide test heads for miniature circuit processing devices which have many more probes in a single test head than was available in the prior art.

Another object of my invention is to provide test heads for miniature circuit processing devices wherein the probes are distributed over a two-dimensional probe area, rather than being disposed in a ring-shaped array, or the like.

A further object of my invention is to provide miniature circuit processing devices, and methods for operating the same, wherein the processing device operator need not directly view the probe tips themselves.

In accordance with a principal feature of my invention, a test head for miniature circuit processing devices is provided wherein the probe tips are located at selected points of a rectangular point matrix, i.e., a rectangular two-dimensional grid.

In accordance with another principal feature of my invention, a rigid miniature circuit processing device test head is provided wherein the shafts of the various probes are rigidly positioned by being affixed in corresponding holes of a vertically disposed plurality of printed circuit boards, said printed circuit boards providing together the lead conductors for interconnecting the shafts of the probes with suitable ribbon cable connectors.

In accordance with yet another principal feature of my invention, a standardized set of matrix test head parts is provided, wherefrom may be readily assembled, without custom fabrication of parts, matrix test heads to satisfy a wide variety of requirements.

In accordance with a yet further principal feature of my invention, each test head of my invention is provided with at least one precision-ruled transparent target or reticle taking the form, e.g., of a grid the interstices of which are collocated in the same collocation as the interstices of the grid over which the probe tips are disposed. Said target or targets being affixed to the test head and precisely located with respect to the corresponding array of probe tips.

Other objects of my invention will in part be obvious and will in part appear hereinafter.

My invention, accordingly, comprises the several steps and the relation of one or more of such steps with respect to each of the others, and the apparatus embodying features of construction, combinations of elements, and arrangements of parts which are adapted to effect such steps, all as exemplified in the following disclosure, and the scope of my invention will be indicated in the appended claims.

For a fuller understanding of the nature and objects of my invention, reference should be had to the following detailed description, taken in connection with the accompanying drawings.

BRIEF DESCRIPTION OF THE DRAWINGS

FIG. 1 is a front view of a wafer prober embodying my invention, in which is mounted a matrix test head embodying my invention;

FIG. 2 is a plan view of the matrix test head of my invention shown in FIG. 1;

FIG. 3 is a bottom view of the matrix test head of my invention shown in FIG. 1;

FIGS. 4 through 7 illustrate the printed circuit boards which are principal components of the matrix test head of my invention shown in FIG. 1;

FIGS. 8A–8C schematically illustrate certain terminology employed herein to describe characteristic features of the printed circuit boards of the matrix test head of my invention shown in FIG. 1;

FIG. 9 is an enlarged partial view of a center portion of the matrix test head of my invention shown in FIG. 1;

FIG. 10 illustrates the reticle pattern employed in the sighting targets of the matrix test head of my invention shown in FIG. 1;

FIG. 11 illustrates the ceramic probe tip collocating pattern of the matrix test head of my invention shown in FIG. 1; and FIGS. 12A–12I illustrate the reticle-miniature circuit alignments seen through the microscope of the wafer prober of my invention shown in FIG. 1 during the employment thereof for testing miniature circuits.

DESCRIPTION OF A PREFERRED EMBODIMENT

Figure 4:
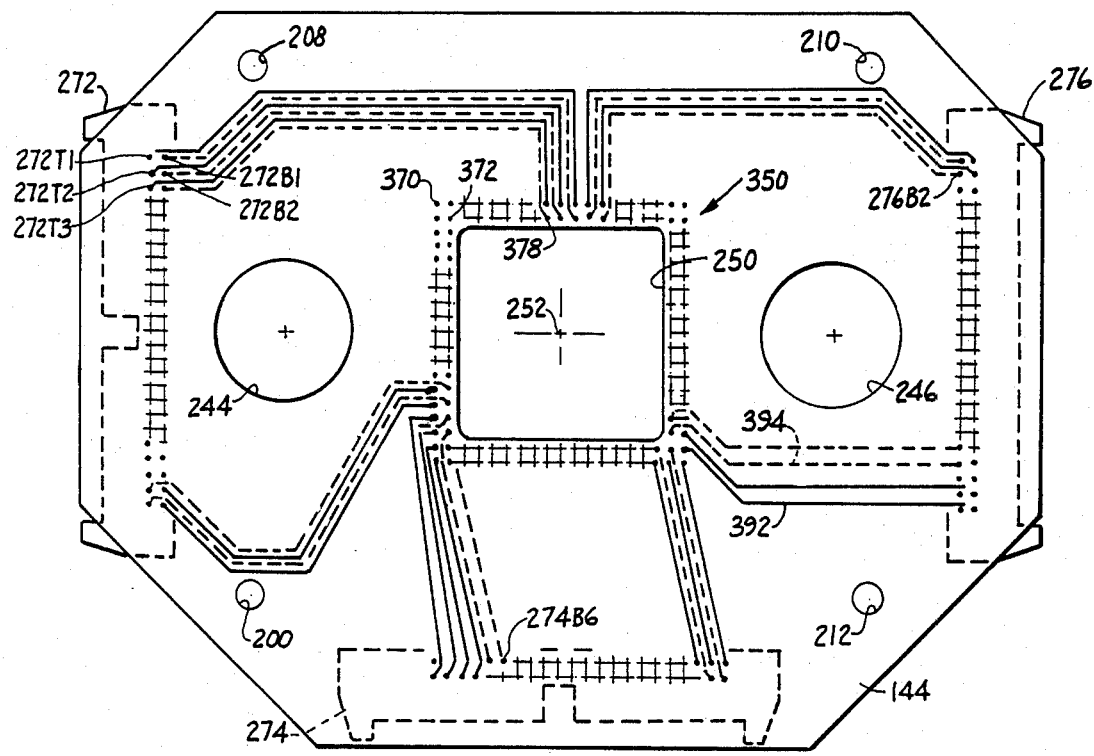

Referring now to FIG. 1, there is shown a matrix test head 10 embodying my present invention.

As further shown in FIG. 1, matrix test head 10 is mounted in a wafer prober 12 which incorporates certain features of my present invention.

It is to be particularly understood that the matrix test heads of my invention are not limited in their use to wafer probers, but rather may also be used in many other devices employed in the processing of miniature circuits.

The term "miniature circuits" as used herein is not limited in its denotation or connotation to monolithic integrated circuits, but rather includes hybrid circuits and all other types of premanufactured circuit devices.

The term "processing" as used herein embraces fabrication, testing, packaging, and in general all of the methods and method steps involved in the manufacture of miniature circuits, controlling their quality, testing them, and preparing them for use.

It is further to be understood that the scope of my invention includes not only matrix test heads embodying my invention but also miniature circuit processing devices adapted for use with matrix test heads embodying my invention and methods of using both said matrix test heads and said devices adapted for use therewith.

Referring again to FIG. 1, it will be seen by those having ordinary skill in the art, informed by the present disclosure, that wafer prober 12 is in many ways like a conventional wafer prober, e.g., the Model 1034 wafer prober made and sold by Electroglas, Inc., of Menlo Park, Calif.

As seen in FIG. 1, wafer prober 12 comprises a base 14, posts 16 (only one shown) mounted on base 14, and a probe assembly carrying table 18, mounted on posts 16, all of which elements are in general found in wafer probers of the prior art.

As further seen in FIG. 1, wafer prober 12 comprises a microscope 20, which is mounted on a supporting column 22, supporting column 22 being itself affixed to base 14 in the well known manner.

In accordance with the principles of my invention, and in contradistinction to the teachings embodied in said Model 1034 wafer prober, microscope 20 is slideably mounted on a crossbeam 24, which is itself rigidly affixed to supporting column 22.

In the preferred embodiment of the wafer prober 12 of my invention crossbeam 24 is provided with a dovetail channel 26 which is adapted to close-fittingly receive a dovetail projection extending from the rear face of microscope 20 (as seen in FIG. 1). Since said dovetail projection is close-fittingly received in dovetail channel 26, microscope 20 can be manually moved from end to end of crossbeam 24, limited only by a pair of stops 28, 30.

Crossbeam 24 is further provided with a pair of microscope locking studs 32, 34, both of which can be withdrawn from their operative positions by depressing control member 36. Studs 32 and 34 are normally spring-biased into their operative positions, being withdrawn from their operative positions only when control member 36 is depressed.

Studs 32 and 34 are both adapted to be close-fittingly received in a recess extending inwardly from the rear face of said dovetail projection, and thus microscope 20 can be locked in either a left-hand position or a right-hand position, the left-hand microscope position being indicated in solid lines in FIG. 1, and the right-hand microscope position being indicated in dashed lines in FIG. 1.

Also seen in FIG. 1 is the vacuum chuck 38 of wafer prober 12 on which is mounted an integrated circuit 400, which is described hereinafter. In the well known manner, vacuum chuck 38 is selectively positionable in the x, y, and z directions, and orientatable at any angle $\theta$ about a vertical axis, by means of well known manually operable control means (not shown).

Referring again to FIG. 1, it will be seen that the matrix test head 10 of my invention comprises a rigid baseplate 40 which is itself close-fittingly received in an opening 42 in table 18. Many means of rigidly maintaining baseplate 40 in opening 42 in table 18 will occur to those having ordinary skill in the art without the exercise of invention.

Referring now to FIG. 2, and comparing the same with FIG. 1, it will be seen that FIG. 2 is an overhead plan view of matrix test head 10, when positioned as in FIG. 1, all of the other parts of wafer prober 12 being eliminated for clarity of illustration.

Similarly, FIG. 3 is a plan view taken from beneath matrix test head 10, when positioned as in FIG. 1, all of the other parts of wafer prober 12 being eliminated for clarity of illustration.

Referring now to FIG. 3, it will be seen that base plate 40 is provided with a central, generally rectangular aperture 60, and two circular apertures 62, 64, each located near an edge of base plate 40. Base plate 40 is also provided with four tapped holes 66, 68, 70, 72, each of which is adapted to receive and engage with a machine screw 74, 76, 78, 80.

As best seen in FIG. 3, base plate 40 is also provided with a recess 82 in its lower face which is adapted to receive a structural member 84 which will hereinafter be called the target plate 84. Target plate 84, like base plate 40, may be machined from aluminum or a suitable aluminum alloy, although my invention is not limited to this choice of materials. Target plate 84 is retained in recess 82 by means, for example, of machine screws 86 through 100.

Target plate 84 is provided with a central circular aperture 101 and two non-central circular apertures 102, 104 for purposes which will be made apparent hereinafter.

As further seen in FIG. 3, a ceramic plate 106 is secured to the lower surface of target plate 84 by cement or suitable clamping means 108, 110, the provision of which is within the scope of those having ordinary skill in the art without the exercise of invention. Plate 106 will hereinafter be called ceramic pattern 106. A plurality of small apertures 112 in ceramic pattern 106, sometimes called probe guide apertures 112 herein, are arrayed in a predetermined array 114, which predetermined array is aligned with aperture 101 in target plate 84. The function of ceramic pattern 106 and its array 114 of probe guide apertures 112 will be described in detail hereinafter.

Also seen in FIG. 3 are two glass plates 116, 118, which will sometimes be called targets or reticles 116, 118 herein. In the preferred embodiment of my invention shown and described herein target or reticle 116 is provided with laser burned or etched cross lines 120, 122, and an array 124 of laser burned or etched wells or pits 126.

Similarly, target or reticle 118 is provided with cross lines 128, 130, and an array 132 of wells or pits 134.

The cross lines and wells of target 116 are aligned with the aforementioned apertures 62 and 102; and the cross lines and wells of target 118 are aligned with the aforementioned apertures 64 and 104.

The function of cross lines 120, 122 and 128, 130, and of the well arrays 124 and 132, will be described in detail hereinafter.

Comparing FIGS. 1, 2, and 3, it will be seen that a top plate 138 and four printed circuit boards 141, 142, 143, and 144 are mounted on base plate 40 by means of machine screws 74, 76, 78, and 80, and are mutually separated by spacers 148 through 186, only part of which are designated in the drawings by reference numerals, for clarity of illustration. All of the twenty spacers may be substantially identical in construction, and may be formed, e.g., from aluminum.

Each machine screw 74, 76, 78, 80 passes through a suitable aperture in top plate 138, corresponding apertures in printed circuit boards 144, 143, 142, and 141, and the central axial bores in the cooperating five spacers. For example, machine screw 78 passes through aperture 198 in top plate 138; the central bore in spacer 148; aperture 200 in printed circuit board 144 (FIG. 4); the central bore in spacer 150; aperture 202 in printed circuit board 143 (FIG. 5); the central bore in spacer 152; aperture 204 in printed circuit board 142; the central bore in spacer 154; aperture 206 in printed circuit board 141; and the central bore in spacer 156; and then is engaged with the threads in aperture 70 of base plate 40.

After machine screws 80, 74, and 76 have been similarly passed through their corresponding holes in printed circuit boards and bores in spacers, etc., and engaged with their corresponding tapped holes in base plate 40, all of the four machine screws 74, 76, 78, 80 are fully and firmly engaged with the threads in their corresponding holes in base plate 40, and thus matrix test head 10 is made into a rigid, multi-tiered structure, as shown in FIG. 1.

It is to be understood, of course, that other parts of matrix test head 10 will be assembled to said printed circuit boards, etc., during the process of assembly described immediately hereinabove.

Before describing the printed circuit boards 141 through 144 of the preferred embodiment in detail, it is noted that certain particular terms are used herein as having the denotations set out immediately below.

The term "point matrix" as used herein denotes any predetermined collocation of geometrical points in a geometrical plane.

The term "rectangular point matrix" as used herein denotes a subset of the points of a plane rectangular coordinate system the coordinates of the points of which subset are all integral multiples of a unit distance.

The term "point square" as used herein denotes all of the points of a rectangular point matrix lying on a square whose edges are bisected by points on the coordinate axes of that rectangular point matrix which are equidistant from its origin point.

The term "n-unit point square" as used herein demotes a point square whose edge bisection points lie unit distances from the origin point of the coordinate axes of that point square.

Thus, any given point of a rectangular point matrix may be identified by a compound designator comprising (1) the n-value of the point square of which it is a member, (2) a colon (:), and (3) the number of points on the periphery of that point square lying between the given point and a point designated as commencement point 1, counting clockwise, plus 2. Where the point square is shown in a drawing, point 1 of that point square will be taken to be the upper left hand corner point of that point square. Thus, in FIG. 8A, point 135 is designated as point 2:7, etc.

The term "n-square point matrix" as used herein denotes a rectangular point matrix consisting of the origin point and the n point square immediately surrounding it.

The term "point matrix of" as used herein with reference to a particular set of elements, such as probe guide apertures or target wells, denotes the collocation of geometrical points congruent to, i.e., which can be brought into one-to-one coincidence with the points of intersection of the axes of said elements with a common defining plane.

In view of the above definitions, it will now be understood by those having ordinary skill in the art that FIG. 8A is a schematic representation of a rectangular point matrix; that the point of origin of that rectangular point matrix is the point designated as 0:0, and that that rectangular point matrix also includes points 1:3; 1:6; and 2:7; inter alia.

It will also be seen that FIG. 8B is a schematic representation of a point square, and more particularly a three-unit point square. It will further be seen that FIG. 8C is a schematic representation of a three-square point matrix.

Referring again to FIG. 4, it will be seen that printed circuit board 144 is provided with apertures 208, 210, and 212, which are adapted to receive machine screws 74, 76, and 80, respectively. Similarly, printed circuit board 143 (FIG. 5) is provided with apertures 214, 216, 218, which are adapted to receive machine screws 74, 76, and 80, respectively; printed circuit board 142 is provided with apertures 226, 228, and 230, to receive machine screws 74, 76, and 80, respectively; and printed circuit board 141 is provided with apertures 220, 222, and 224, to receive machine screws 76, 78, and 80, respectively.

Comparing FIGS. 4 through 7, it will be seen that each of the four printed circuit boards is provided with two large circular apertures, viz., apertures 232 and 234 in printed circuit board 141; apertures 236 and 238 in printed circuit board 142; apertures 240 and 242 in printed circuit board 143; and apertures 244 and 246 in printed circuit board 144.

The position of each of these large circular apertures is registered with respect to the just described mounting holes 200, 202, 204, 208, 210, etc., so that when said printed circuit boards are rigidly mounted between top plate 138 and base plate 40, as described hereinabove, holes 232, 236, 240, and 244 are aligned, and their axes substantially coincide with the principal optical axis of microscope 20 when microscope 20 is in its left hand (solid line) position as seen in FIG. 1, and base plate 40 is affixed in opening 42 in table 18 as shown in FIG. 1; and holes 234, 238, 242, 246 are aligned, and their axes substantially coincide with the principal optical axis of microscope 20 when microscope 20 is in its right hand (dashed line) position as shown in FIG. 1, and base plate 40 is affixed in opening 42 in table 18 as shown in FIG. 1.

Referring again to FIG. 4, it will be seen that printed circuit board 144 of the preferred embodiment of the present invention is provided with a generally square central opening 250 which is substantially symmetrical about a center point 252. Similarly, printed circuit board 143 (FIG. 5) is provided with a generally square central opening 254 which is substantially symmetrical about a center point 256, and printed circuit board 142 (FIG. 6) is provided with a generally square central opening 258 which is substantially symmetrical about a center point 260.

Figure 5:
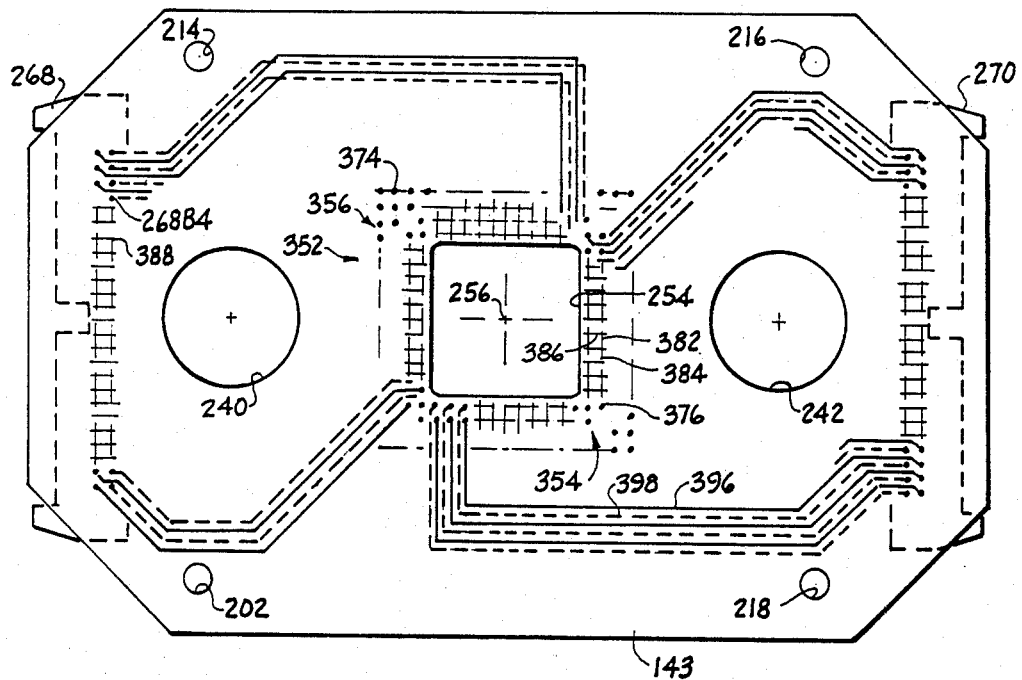

In the preferred embodiment of the present invention each one of the center points 252, 256, and 260 is located substantially equidistantly from the centers of the four mounting holes in the same printed circuit board, and the edges of the openings 250, 254, 258 are parallel to lines connecting the centers of the mounting holes, all as shown in FIGS. 4 through 6. Thus, it will be seen that the center points 252, 256, and 260 will lie substantially on a line perpendicular to the top face of baseplate 40, when the printed circuit boards are assembled between top plate 138 and baseplate 40 as described hereinabove.

Referring now to FIG. 7, it will be seen that printed circuit board 141 is provided with a ribbon cable connector 262 of well-known type, whereby the individual conductors of a flexible ribbon cable may be respectively connected to individual printed conductors disposed on printed circuit board 141, some of said printed conductors being disposed on one side of printed circuit board 141, and some on the other. In the well-known manner, the inner ends of the contact pins of connector 262 pass through plated through holes in printed circuit board 141, and thus solder connections between said inner ends of said contact pins and their associated printed conductor terminations may be made from one side of printed circuit board 141 regardless of the side of the printed circuit board 141 on which any particular printed conductor is located.

Similarly, printed circuit board 142 (FIG. 6) is provided with two ribbon cable connectors 264, 266 for the purpose of making connections between at least some of the printed conductors disposed one both sides of printed circuit board 142 and corresponding conductors of two ribbon cables; printed circuit board 143 (FIG. 5) is provided with two ribbon cable connectors 268, 270 for the purpose of making connections between printed conductors disposed on both sides of printed circuit board 143 and at least some of the conductors of two ribbon cables; and printed circuit board 144 (FIG. 4) is provided with three ribbon cable connectors 272, 274, 276 for the purpose of making connections between printed conductors disposed on both sides of printed circuit board 144 and at least some of the conductors of three ribbon cables.

For convenience, the ribbon cable and associated female connector which cooperate with any particular ribbon cable connector 262 through 276 will be identified herein by the reference numeral of that particular ribbon cable connector augmented by 1.

The arrays of inner ends of connector contact pins of each connector 262 through 276 are shown in part immediately thereabove. As will be understood by those having ordinary skill in the art, some of said inner contact pin ends will be coated with solder, and a few will not, and the selection of the inner contact pin ends to be coated with solder will be done by those having ordinary skill in the art, informed by the present disclosure, without the exercise of invention.

In the preferred embodiment each of the connectors 262 through 276 is a Berg fifty pin male ribbon cable connector, No. 65483-029, affixed to its associated printed circuit board in well known manner.

It is to be particularly noted that in accordance with the principles of my invention the aperture 280 in printed circuit board 141 (FIG. 7) is so located with respect to mounting holes 206, 220, 222, and 224 that when matrix test head 10 is completely assembled aperture 280 and the abovedescribed center points 252, 256, and 260 will lie substantially on a common straight line 282 which will sometimes be called herein the "test head axis".

It should also be noted that the centers of the printed circuit board apertures 232, 236, 240, 244 lie on a common straight line 284 (FIGS. 1 and 2) which is sometimes called herein the "left microscope axis", or substantially so.

It should also be noted that the centers of the printed circuit board apertures 234, 238, 242, and 246 lie on a common straight line 286 (FIGS. 1 and 2) which is sometimes called herein the "right microscope axis", or substantially so.

When matrix test head 10 is completely assembled axes 282, 284, and 286 are all substantially parallel to each other, and are all substantially perpendicular to the lower face of baseplate 40.

Referring to FIG. 9, the structure and operating principles of the parts of matrix test head 10 which are supported on printed circuit boards 141 through 144, top plate 138, and base plate 40 will now be generally described.

FIG. 9 is a partial sectional view of the lower central portion of matrix test head 10. The cutting plane of FIG. 9 contains the test head axis 282 and the microscope axes 284 and 286.

It is to be particularly understood that FIG. 9 is a partial view only, and thus shows only enough parts or elements of matrix test head 10 to exemplify the general principles of the construction of a matrix test head embodying my invention. Thus, it is not to be expected that every part or element of matrix test head 10 shown in FIG. 1 will also be shown in FIG. 9.

In FIG. 9, the dashed line 288 represents the surface of a miniature circuit which is to be tested by means of matrix test head 10.

In accordance with the principles of my invention, surface 288 is contacted by a plurality of probe tips 290.1, 290.2, etc., each of which is the lower end of a probe wire 292.1, 292.2, etc. In the preferred embodiment of my invention each probe wire is a 0.005 inch palladium wire, although other wires such as tungsten wire or beryllium-copper wire may be used for the probe wires in certain embodiments of my invention.

It is to be particularly noted that the reference numeral 290 will sometimes be used herein to designate the probe tips of matrix test head 10, collectively or individually, while at other times the individual probe tips will be distinguished by reference numerals having particular suffixes to indicate particular individual probe tips. The same convention will be adapted herein with respect to the below-described probe wires, guides, etc.

As futher seen in FIG. 9, each test probe wire 292.1, 292.2, etc., is respectively contained within an associated tube 294.1, 294.2, etc. In accordance with the principles of my invention, each test probe wire 292 is slidable within its associated tube 294. These tubes, i.e., 294.1, 294.2, etc., will sometimes be called "probe guides" herein. In the preferred embodiment of my invention the probe guides 294 are formed from seamless stainless steel surgical tubing having an outside diameter of approximately 0.013 inches and an inside diameter of approximately 0.006 inches.

The term "probe" will sometimes be used herein to denote one or more of the illustrated combinations of probe wire and associated probe guide. For example, probe wire 292.1 and its associated probe guide 294.1 may sometimes be referred to as the probe 296.1 herein, etc.

As further seen in FIG. 9, the probes 296 (i.e., 296.1, 296.2, 296.3, etc.) are mounted in and affixed to ceramic pattern 106 and one or both of the printed circuit boards 141 and 142. In the preferred embodiment, the lower ends of probe guides 294 (i.e., 294.1, 294.2, 294.3, etc.) pass through probe guide apertures 112 (i.e., 112.1, 112.2, 112.3, etc.) and are fixed therein by means of epoxy cement 298 or the like. All of the probes shown in FIG. 9 also pass through apertures 300 (i.e., 300.1, 300.2, 300.3, etc.) in printed circuit board 141, which are plated through holes in the preferred embodiment, and are affixed therein by soldering. Similarly, probes 296.1 and 296.2 pass through plated through holes 302 (i.e., 302.1 and 302.2, etc.) in printed circuit board 142, and are fixed therein by soldering.

As also seen in FIG. 9, each probe guide 294 is connected by a solder joint to one of the printed conductors of one of the printed circuit boards 141, 142. Thus, for example, probe guide 294.1 is electrically directly connected to printed conductor 304 of printed circuit board 142 by means of solder joint 306; probe guide 294.3 is electrically directly connected to printed conductor 308 of printed circuit board 141 by means of solder joint 310; etc.

It is to be particularly noted that none of said solder joints contacts its associated probe wire. It is also to be noted that experience with embodiments of the present invention has shown that the extensive contact between the probe wires and their surrounding probe guides results in a very low impedance electrical connection therebetween, such that the impedance measured between any probe tip 290 and its associated printed conductor is very low.

In accordance with the principles of my invention, each probe of the preferred embodiment of FIG. 1 is electrically connected to one and only one printed conductor out of the complete set of printed conductors, i.e., the totality of the printed conductors found on the upper and lower surfaces of all four printed circuit boards 141 through 144.

As will now be understood by those having ordinary skill in the art, informed by the present disclosure, the probes 296, the printed conductors on printed circuit boards 141 through 144, the connectors 262 through 276, and the solder joints between those printed conductors and their associated probes and connector contact pins are so constructed and arranged that when the ribbon cables and associated female connectors 263 through 277 are connected to the male connectors 262 through 276, each probe tip 290 is substantially directly connected to one and only one ribbon cable conductor.

As further seen in FIG. 9, a plate 309 bears against the upper ends of the probe wires 292.1, 292.2 which terminate above printed circuit board 142. Similarly, a plate 311 bears upon the upper ends of the probe wires 292.3, 292.4, 292.5, etc., which terminate at printed circuit board 141. Insulative plates 309 and 311 will sometimes be called "contact pressure plates" or "pressure plates" herein, and are rigid ceramic plates in the preferred embodiment.

Located above pressure plate 311, and passing through an aperture 312 in pressure plate 309, is a shaft or column 314 the upper end of which is affixed to top plate 138 (FIG. 1), and thus cannot move upwardly with respect to the printed circuit boards 141 through 144.

Located immediately above insulative pressure plate 309 is a rigid plate 316 which is herein sometimes called a truss plate. Truss plate 316 is provided with a bore 318 which loosely fits shaft 314. Shaft 314 is provided with a transverse bore 320 which is adapted to close-fittingly receive a pin 322. Pin 322 extends outwardly from both ends of bore 322, and thus engages a notch or groove 324 in the upper surface of truss plate 316, preventing truss plate 316 from moving upwardly with respect to the printed circuit boards 141, 142, etc.

Referring again to the central portion of FIG. 9, it will be seen that the lower end of shaft 314 is provided with a central, coaxial cylindrical bore 326, which contains the major portion of a coil spring 328. Thus, coil spring 328 is captive between insulative pressure plate 311 and the inner end of bore 326. It follows that, since shaft 314 cannot move upwardly with respect to printed circuit board 141, coil spring 328 exerts a downward force upon plate 311, which force is transferred thereby to the upper ends of the probe wires 292.3, 292.4, 292.5, etc., and thus forces the probe tips 290.3, 290.4, 290.5, etc., into firm electrical contact with the top surface 288 of the miniature circuit being tested in wafer prober 12. (As noted above, the probe wires are longitudinally movable in their associated probe guides.)

In accordance with the teachings of the preferred embodiment of my invention, truss plate 316 is discate in form, and has a circular periphery centered on test head axis 282, which also coincides with the axis of shaft 314. Truss plate 316 is provided with a plurality of downwardly directed recesses, only one of which, viz., 330, is shown in FIG. 9.

As will be evident to those having ordinary skill in the art, informed by the present disclosure, the several coil springs, 332, etc., located in these recesses, 330, etc., in the lower face of truss plate 316, cause insulative pressure plate 309 to resiliently bear upon the upper ends of the probe wires 292.1, 292.2, etc., and thus force the tips 290.1, 290.2, etc., of those probe wires to make firm electrical contact with the surface 288 of the miniature circuit being tested in wafer prober 12.

Comparing FIG. 1 with FIG. 9, it will be seen that in addition to insulative pressure plates 309 and 311 just described matrix test head 10 further comprises pressure plates 334 and 338, each of these pressure plates being of greater diameter than the one immediately below it. Further, it will be seen that in addition to the just described truss plate 316 matrix test heed 10 also comprises truss plates 336 and 340. Truss plates 336 and 340 are both pinned to shaft 314 in the same manner in which truss plate 316 is pinned to shaft 314. Truss plates 336 and 340 are both provided with downwardly opening recesses containing coil springs in the same manner in which truss plate 316 is provided with downwardly opening recesses containing coil springs 330, etc.

In view of the above, it will now be apparent to those having ordinary skill in the art, informed by the present disclosure, that the lower end or tip of each probe wire in matrix test head 10 is forced into firm electrical contact with any miniature circuit being tested by wafer prober 12 by means of a coil spring or group of coil springs which depresses a pressure plate which bears upon the upper end of that probe wire. It is to be understood that in accordance with the principles of my invention each coil spring must be so constructed and arranged, in accordance with the number of coil springs with which it cooperates, and the number of probe wires which it or its associated group of coil springs drives, that the contact force between each probe tip and its registered area of the miniature circuit surface 288 is substantially equal to all of the others of such contact forces.

As will now be evident to those having ordinary skill in the art, informed by the present disclosure, each one of the matrix test heads of my invention will in general be custom made for the testing of a particular kind or type of miniature circuit, although substantial duplicate matrix test heads embodying my invention will sometimes be made when it is desired, e.g., to test such a large number of one kind of miniature circuit that a plurality of wafer probers must be used simultaneously.

Further, it will be understood by those having ordinary skill in the art, informed by the present disclosure, that when the areas of a particular miniature circuit which are to be contacted by the probe tips of a matrix test head of my invention are not coplanar, the lengths of the probe wires of that matrix test head will be correspondingly altered by those having ordinary skill in the art without the exercise of invention.

Referring now to FIG. 4, it will be seen that the inner ends of the contact pins of connector 272, each of which projects through a corresponding plated-through hole in printed circuit board 144, are respectively designated by reference designators which are made up of (1) the reference numeral of the connector, (2) T or B in accordance with whether the printed conductor connected thereto is affixed to the top or bottom of printed circuit board 144, as seen in FIG. 4, and (3) a number indicating the position of the particular contact pin inner end with respect to one end of the connector, i.e., the top end in connectors which are vertically disposed in FIG. 4, and the left-hand end of the connector which is horizontally disposed in FIG. 4. Thus, the reference designator 272T3 designates the third T pin from the top of connector 272 as seen in FIG. 4. Similarly, the reference designator 274B6 designates the sixth pin from the left-hand end of connector 274, as seen in FIG. 4, which is connected to a bottom printed conductor, i.e., a printed conductor affixed to the back of printed circuit board 144 when viewed as seen in FIG. 4, and thus shown in dashed lines in FIG. 4. Following the same convention, it will be seen by those having ordinary skill in the art that the inner end of the contact pin of connector 276 which is connected to a bottom printed conductor of printed circuit board 144 and is a member of the second pair of contact pins from the top of connector 276, as seen in FIG. 4, is designated by the reference designator 276B2.

Referring now to FIG. 5, and keeping in mind the abovedescribed convention for designating connector pin inner ends, it will be seen that pin inner end 268B4 is a member of the fourth pair of contact pins from the top of connector 268, as seen in FIG. 5, and is connected to a bottom or B printed conductor, which is located on the back of printed circuit board 143, as seen in FIG. 5.

The proper designation of the inner end of any contact pin of any connector shown in FIGS. 4 through 7 will now be within the scope of one having ordinary skill in the art, informed by the present disclosure.

Referring again to FIG. 4, it will be seen that opening 250 is surrounded by an array 350 of holes. The point hole array 350 consists of a nine-unit point square and an eight-unit point square, both of which are members of the same rectangular point matrix, the 0:0 point or origin of this rectangular point matrix being coincident with center point 252 of opening 250, and the coordinate axes of this rectangular point matrix being parallel to one pair of the four lines interconnecting the centers of apertures 200, 208, 210 and 212. As will be evident from the above disclosure, and particularly from FIG. 1, each of these holes is a plated-through hole which is adapted to close-fittingly receive the upper end of a probe guide, and to be joined to the upper end of that probe guide by soldering. Such holes will sometimes be called "probe guide connection holes" herein. As will be understood by those having ordinary skill in the art, informed by the present disclosure, most embodiments of my present invention will comprise probe guide connection holes which contain probe guides soldered therein and probe guide connector holes which do not contain probe guides. However, it will in general be found more convenient and economical to drill and plate through all of the holes of both the eight-unit point square and the nine-unit point square, even though not all of these holes will be used in a particular embodiment of my present invention.

Referring now to FIG. 5, it will be seen that opening 254 is surrounded by an array of holes 352 the outer two square rings of which are shown in part only. The point matrix of hole array 352 consists of a nine-unit point square, an eight-unit point square, a seven-unit point square, and a six-unit point square, all of which are members of the same rectangular point matrix, the 0:0 point or origin of this rectangular point matrix being coincident with center point 256 of opening 254, and each of the coordinate axes of this rectangular point matrix being parallel to a pair of the four lines intersecting the centers of apertures 202, 214, 216, 218.

As will be evident from the above disclosure, and particularly FIG. 1, each of the holes of array 352 which corresponds to a point of one of the two inner point squares of the point matrix of hole array 352 is a plated-through probe guide connection hole which is adapted to close-fittingly receive a probe guide, and to be joined to that probe guide by soldering. These probe guide connection holes, sometimes called collectively the probe guide connection hole array 354, will in most embodiments of my invention comprise occupied holes which contain probe guides which are soldered therein and unoccupied holes which do not contain probe guides, depending upon the configuration of the miniature circuit to be tested.

Each of the holes of hole array 352 which corresponds to a point of one of the two outer point squares of the point matrix of hole array 352 is an unplated probe guide clearance hole which is adapted to close-fittingly receive one of the probe guides whose upper end is soldered in one of the probe guide connection holes of hole array 350 of printed circuit board 144.

These probe guide clearance holes will sometimes be called collectively the probe guide clearance hole array 356 herein.

Referring now to FIG. 6, it will be seen that opening 258 is surrounded by an array of holes 358 the outer square rings of which are shown in part only. The point matrix of hole array 358 consists of a nine-unit point square, an eight-unit point square, a seven-unit point square, a six-unit point square, a five-unit point square, and a four-unit point square, all of which are members of the same rectangular point matrix, the 0:0 point or origin of this rectangular point matrix being coincident with center point 260 of opening 258, and each coordinate axis of this rectangular point matrix being parallel to a pair of the four lines interconnecting the centers of apertures 204, 226, 228, and 230.

As will be evident from the above disclosure, and particularly from FIG. 1, each of the holes of hole array 358 which corresponds to a point of one of the two inner point squares of the point matrix of hole array 358 is a plated-through probe guide connection hole which is adapted to close-fittingly receive a probe guide, and to be joined to that probe guide by soldering. These probe guide connection holes, sometimes called collectively the probe guide connection hole array 360, will in most embodiments of my present invention comprise occupied holes which contain probe guides which are soldered therein, and unoccupied holes which do not contain probe guides, depending upon the configuration of the miniature circuit to be tested.

The remaining holes of hole array 358 are unplated probe guide clearance holes which are adapted to close-fittingly receive one of the probe guides whose upper end is soldered in one of the probe guide connection holes of array 352, or one of the probe guide connection holes of array 350. These probe guide clearance holes will sometimes be called collectively the probe guide clearance hole array 362 herein.

Referring now to FIG. 7, it will be seen that printed circuit board 141 is provided with an array 364 of holes, each of which is adapted to receive a probe guide 296. The point matrix of hole array 364 is a nine-square point matrix the 0:0 point or origin of which is coincident with center point 280, and each of whose coordinate axes is parallel to a pair of the lines interconnecting apertures 206, 220, 222, and 224. The unit distance of the point matrix of hole array 364 is equal to the common unit distance of all of the other probe guide hole arrays 360, 352, and 350. Hole array 364 consists of an inner hole array 366 and an outer hole array 368. The point matrix of inner hole array 366 is a three-square point matrix.

The holes of hole array 366 are plated-through probe guide connection holes, each adapted to close-fittingly receive a corresponding probe guide 296 and be connected thereto by soldering. These probe guide connection holes of inner hole array 366 will in most embodiments of my invention comprise occupied holes which contain probe guides which are soldered therein, and empty holes which do not contain probe guides, depending upon the configuration of the miniature circuit to be tested.

The point matrix of outer hole array 368 consists of the points of the point matrix of hole array 364 other than the points of the point matrix of inner hole array 366.

The holes of outer hole array 368 are not plated-through holes, and are sometimes collectively called the probe guide clearance hole array 368 herein.

The convention is adopted herein of sometimes designating probe guide holes in printed circuit boards 141, 142, 143, and 144 by corresponding probe guide hole designators consisting of (1) the printed circuit board reference numeral corresponding to the printed circuit board through which the designated hole passes, (2) a colon, and (3) the compound designator of the point matrix point corresponding to the designated hole, taking the commencement point 1 on the point square including the designated hole to be the upper left-hand hole of that point square as seen in the figure of the present drawings in which the designated hole is located.

Thus, for example the point matrix point of probe guide connection hole 370 in printed circuit board 144 of FIG. 4 is the commencement point of the nine-unit point square of which it is a member. Also, the point matrix point of probe guide connection hole 372 in FIG. 4 is the commencement point of the eight-unit point square of which it is a member. Similarly, the point matrix point of hole 374 of FIG. 5 is the commencement point of the eight-unit point square of which it is a member.

In view of the just described convention it will be seen by those having ordinary skill in the art that hole 376 in printed circuit board 143 (FIG. 5) can be alternatively designated as hole 143:7:28. By the same convention, hole 378 in FIG. 4 can be alternatively designated as hole 144:8:8; and hole 380 in FIG. 7 can be alternatively designated as hole 141:3:7.

For ease of comprehension of the present drawings, some of the holes in the printed circuit boards of FIGS. 4 through 7 are shown by the intersection of a pair of center lines, rather than being shown as a circle. For example, hole 382 or 143:7:22 (FIG. 5) is schematically shown by an intersection of hole center lines 384 and 386.

Similarly, connector contact pin holes in the printed circuit boards of FIGS. 4 through 7, such as hole 388 of FIG. 5, and hole 390 of FIG. 7, are schematically shown as center line intersections, rather than being shown as small circles. Where confusion will not arise, the convention is sometimes adopted herein of designating a connector contact pin hole by the reference numeral given to the connector contact pin inner end disposed therein. Thus, connector contact pin hole 388 may sometimes be designated as connector contact pin hole 268B7 herein.

Also, for ease of comprehension of the present drawings, the complete set of printed conductors borne by the printed circuit boards 141, 142, 143 and 144 is not illustrated herein. Rather, only so many printed conductors are shown on each of these printed circuit boards as will indicate the general arrangement of printed conductors on each printed circuit board; it being well within the scope of those having ordinary skill in the art, informed by the present disclosure, to provide the printed conductors necessary for the testing of any particular miniature circuit. Further, it is to be understood that solid lines, such as line 392 (FIG. 4) represent top or T printed conductors which lie above the printed circuit boards shown in FIGS. 4 through 7; whereas dashed lines, such as line 394 (FIG. 4) represent bottom or B printed conductors, which lie below the printed circuit boards shown in FIGS. 4 through 7.

Each printed conductor borne by one of the printed circuit boards of FIGS. 4 through 7 may alternatively be designated by a designator which consists of a hyphen separating the designators of the elements which it interconnects. Thus, for example, printed conductor 396 of FIG. 5 may be designated as 270T23-143:7:39; and printed conductor 398 of FIG. 7 may be designated as 262B24-141:2:13.

Referring now to FIG. 10, there is shown a small central portion of transparent glass plate or target 116, which is also shown in FIG. 3. It is to be understood that target 118, also shown in FIG. 3, is substantially identical to target 116. Target 116 is fabricated from transparent glass, and is cemented to the lower face of back plate 40 at the location shown in FIG. 3. The cross lines 120 and 122 and the pits or wells 126 in the surface of target 116 are provided with a substantially identical set of cross lines and wells or pits.

In the preferred embodiment of my invention shown and described herein the cross lines are 0.0005 inches in diameter, to a tolerance of 0.0001 inches.

In the preferred embodiment each pit or well 126 is 0.0002 inches in diameter, to a tolerance of 0.0001 inches. In the preferred embodiment the distance D between any pair of wells 126, parallel to either cross line 120, 122, is 0.0200 inches, to a non-accumulative tolerance of 0.0005 inches. The cross lines are perpendicular to each other. In the preferred embodiment, the array 124 of wells 126 is a square, each side of which, from extreme pit to extreme pit, measures 0.3600 inches, to a tolerance of 0.0005 inches, and the target itself is square in shape, either side of the square measuring about 1.00 inches. As seen in FIG. 3, the intersection of cross lines 120 and 122 lies on the left hand microscope axis 284.

The intersection of cross lines 128 and 130 of target 118 lies on the right hand microscope axis 286.

As also seen in FIG. 3, the cross line 122 of target 116 is collinear with the cross line 130 of target 118, and if extended would intersect with the two microscope axes 284 and 286, and would also intersect with the test head axis 282.

Referring now to FIG. 11, there is shown a small central portion of ceramic pattern 106, which is also shown in FIG. 3. In the preferred embodiment of my present invention shown and described herein ceramic pattern 106 is fabricated from a suitable ceramic material, and is provided with a plurality of probe guide apertures 112 arrayed in a predetermined array 114. In the preferred embodiment, the point matrix of array 114 constitutes certain preselected points of a nine-square point matrix, and the distance D' between the centers of the most closely adjacent probe guide apertures of array 114, i.e., the unit distance of said nine-square point matrix, is 0.200 inches, to a non-accumulative tolerance of 0.0005 inches. In the preferred embodiment, the diameter of each of the probe guide apertures is 0.0145 inches, to a tolerance of 0.005 inches. As indicated in FIG. 3, the central probe guide aperture 112 of array 114, which corresponds to the 0:0 point or origin point of said nine-square point matrix, is so located on back plate 40 that its centerline coincides with test head axis 282. In the preferred embodiment, one of the coordinate axes of said nine-square point matrix of array 114, if extended, would intersect microscope axes 284 and 286. As will now be evident to those having ordinary skill in the art, ceramic pattern 106 maintains the lower ends of the probes 296 in the same predetermined collocation or array as that of the probe guide apertures 112, i.e., array 114. In fabricating a matrix test head of the preferred embodiment of my present invention, the configuration of array 114, i.e., the particular points of said nine-square point matrix to which apertures 112 of array 114 correspond, will be determined by those having ordinary skill in the art, taught by the present disclosure, in accordance with the miniature circuit to be tested, and particularly the collocation of the contact pads or contact points thereon which are to be contacted by the matrix test head of my present invention for test purposes.

Referring now to FIGS. 12A through 12I, there are shown various partial views of a silicon wafer 400 which is mounted on vacuum chuck 38 (FIG. 1).

In the well-known manner, the upper surface of silicon wafer 400 is subdivided into a plurality of dies 401 by a plurality of scribe lines 404. It is to be particularly understood that while each die 401 of FIGS. 12A through 12I, in the usual employment of my invention, will be an integrated circuit "chip" having a large number of printed circuit elements deposited thereon, the circuit elements on each die 401, with the exception of certain ones of the usual bonding pads, are omitted from FIGS. 12A through 12I for clarity of illustration of the basic methods of my invention.

Further, it is to be understood that the matrix test head 10 and wafer prober 12 of my invention can be used for the processing of other miniature circuits than silicon integrated circuits.

It is yet further to be understood that only some of the bonding pads 402 of the dies 401 are shown in FIGS. 12A through 12I, the remainder thereof being omitted for clarity of illustration.

Also shown in the two outer columns of FIG. 12, i.e., FIGS. 12A, 12D, and 12G, and 12C, 12F, and 12I, are the pits or wells 126 of the corresponding transparent glass targets 118, 116 of matrix test head 10.

It is further to be particularly understood that only the corner bonding pads 402 on each die 401 are shown in FIG. 12.

It is further to be understood that the right-hand column of FIG. 12, i.e., FIGS. 12A, 12D, and 12G, shows, schematically and in part only, various views which will be seen through microscope 20 when it is in its left-hand (solid line) position as seen in FIG. 1; and that the left-hand column of FIG. 12, i.e., FIGS. 12C, 12F, and 12I, shows, schematically and in part only, various views which will be seen through microscope 20 when it is in its right-hand (dashed line) position as seen in FIG. 1.

As will become apparent hereinafter, the middle column of FIG. 12, i.e., FIGS. 12B, 12E, and 12H, shows, schematically and in part only, an area of silicon wafer 400 which is located beneath the array of probe tips 290, and thus is not visible to the operator of wafer prober 12.

It is also to be understood that the top row of FIG. 12, i.e., FIGS. 12A, 12B, and 12C, represents conditions which obtain when the horizontal scribe lines or "streets" 404 of silicon wafer 400 make a positive or clockwise angle $\theta$ with the x traverse direction of vacuum chuck 38; and that the bottom row of FIG. 12, i.e., FIGS. 12G, 12H, and 12I, represents the conditions which obtain when the "streets" 404 of silicon wafer 400 make a negative or clockwise angle $\theta$ with the x traverse direction of vacuum chuck 38.

It is also to be understood that the middle row of FIG. 12, i.e., FIGS. 12D, 12E, and 12F, represents conditions which obtain when silicon wafer 400 is correctly aligned, i.e., when the horizontal "streets" 404 of silicon wafer 400 are aligned with the x traverse direction of vacuum chuck 38.

In the well-known manner, wafer prober 12 includes servo means for selectively moving vacuum chuck 38 in three mutually perpendicular directions, x, y, and z. In FIG. 1, the x traverse direction is horizontal and parallel to the plane of the figure, while the y direction is perpendicular to the plane of the figure. Also, in FIG. 1, the z traverse direction is vertical and parallel to the plane of the figure. Wafer prober 12 is also provided with servo means for rotating vacuum chuck 38 about a z axis through a clockwise or counter-clockwise angle $\theta$, in the well-known manner. Also in the well-known manner, wafer prober 12 is provided with manually operable control means for selectively, independently controlling the motion of vacuum chuck 38 in said three mutually perpendicular directions, and for selectively, independently controlling the rotation of vacuum chuck 38 through selected angles $\theta$ about a z axis.

It is also to be understood that the distance from the axis of any probe tip 290 in the plane of the lower faces of the targets 116, 118 to the corresponding point of either target 116, 118 is 2.0000 inches to a tolerance of 0.0001 inches. As will be evident to those having ordinary skill in the art, informed by the present disclosure, the two distances between the axis of any probe tip 290 and its corresponding points in the respective targets 116, 118 will both be measured in the x traverse direction when matrix test head 10 is mounted in wafer prober 12, and correctly aligned.

In making the initial adjustment of matrix test head 10 to wafer prober 12, matrix test head 10 is mounted in wafer prober 12 and a silicon wafer 400 of the kind with which matrix test head 10 is intended to cooperate is mounted on vacuum chuck 38 in the well-known manner.

The manual control means for said servo means are then manipulated to bring silicon wafer 400 to the position shown in FIG. 1, in which "streets" and pads of silicon wafer 400 can be seen through microscope 20 in either position thereof.

In accordance with a principal feature of my invention, a miniature circuit processing device adapted to utilize the matrix test head of my invention is provided with either two fixed microscopes directed along two different optical axes or a single movable microscope which can alternatively be directed along two different optical axes, as in wafer prober 12 of the preferred embodiment shown and described herein.

Assuming that a particular matrix test head 10 of my invention is about to be installed in a wafer prober 12 of my invention for the testing of a large number of miniature circuits of the particular type with which this particular matrix test head 10 is designed to cooperate, the initial adjustment mode of my invention will now be described:

1. A miniature circuit device of said particular type, e.g., a silicon wafer 400 as shown in FIG. 12, is mounted on vacuum chuck 38 of wafer prober 12 in the well-known manner.

2. By manipulating the manual positioning controls of wafer prober 12 in the well-known manner silicon wafer 400 is brought into view in microscope 20, which is, for example, in its right-hand (dashed line) position.

3. Said manual positioning controls are then further manipulated until a particular well 126.1 selected by eye, is immediately adjacent and tangent to a particular horizontal "street" 404 of silicon wafer 400, as seen through microscope 20, and remains adjacent and tangent to that same particular "street" 404 while silicon wafer 400 is traversed past the particular well 126.1 by the continuing depression of the x traverse control until several vertical "streets" 404 have passed said particular well 126.1.

4. When step 3 supra has been completed, the x and y manual positioning controls of wafer prober 12 are then operated to inchingly bring a set of four wells 126.1, 126.2, 126.3, and 126.4 into their respective positions at the four corners of a "street intersection" 408, as seen in FIG. 12F, or as close thereto as possible.

5. After achieving the "street intersection" - well juxtaposition shown in FIG. 12F, or closely approaching it, said manual positioning controls are manipulated to translate the particular silicon wafer 400 mounted in vacuum chuck 38 exactly 2.0000 inches to the left (as seen in FIG. 1); this distance, 2.0000 inches, to a tolerance of 0.0001 inches, being the distance in the x direction between test head axis 282 and either microscope axis 284, 286.

6. Microscope 20 is then manually moved from its right-hand position to its left-hand position.

7. After steps 5 and 6 have been completed a set of four adjacent wells 126 will usually be located close to but not perfectly aligned with each "street intersection" seen under microscope 20. Said manual positioning controls are then manipulated to bring each such set of four wells and the closely adjacent "street intersection" into the type of "street intersection" - well juxtaposition shown in FIG. 12F.

8. After the completion of step 7, said manual positioning controls are manipulated, in the well-known manner, to translate the silicon wafer 400 mounted in vacuum chuck 38 2.0000 inches to the right in the x direction.

9. After the completion of step 8 one die of silicon wafer 400 will be registered with the intersection 284 of cross lines 120 and 122, as seen through microscope 20, in the same way in which the die located beneath probe tips 290 is registered therewith, and thus it is only necessary to so manipulate said manual positioning controls as to bring intersection 284 of cross lines 120 and 122 into registration with an index mark indicating the center of the die which underlies it in order to register the probe tips 290 with the proper pads or other contact points of the die which underlies them for the testing of that die by the testing computer which is associated with wafer prober 12, in the well-known manner.

After steps 1 through 9 have been performed the operator of wafer prober 12 can, in the well-known manner, and given the data on the work ticket which accompanies the particular silicon wafers to be next tested, program wafer prober 12 to automatically test the die beneath it, and to seriatim test all of the other dies on the same silicon wafer.

As will now be evident to those having ordinary skill in the art, informed by the present disclosure, it will not be necessary to carry out steps 1 through 9 each time a new silicon wafer is tested. Rather, it will in general be necessary only to align intersection 284 with one of said index marks on the new silicon wafer to be tested whenever a new silicon wafer or other miniature circuit device is mounted on vacuum chuck 38 for testing, so long as the particular matrix test head of my invention in the wafer prober is not changed. Indeed, it may not be necessary to align the index mark with an intersection 284 in all cases.

It will thus be seen that the objects set forth above, among those made apparent from the preceding description, are efficiently attained, and, since certain changes may be made in the above constructions without departing from the scope of the invention, it is intended that all matter contained in the above description or shown in the accompanying drawings shall be interpreted as illustrative only, and not in a limiting sense.

It is to be particularly noted that although my invention has been disclosed as embodied in a matrix test head comprising four printed circuit boards, 141, 142, 143 and 144, my invention also embraces matrix test head embodiments in which the number of printed circuit boards is different from four, or a single printed circuit board is employed. Furthermore, while I have shown and described the individual conductors of the ribbon connectors as being connected to the individual probe guides by means of printed circuit boards, my invention is not limited to devices wherein such interconnections are effected by printed circuit boards.

Yet further, while I have shown and described certain features of my invention as embodied in a wafer prober, my invention is equally applicable to other miniature circuit processing devices.

Furthermore, while I have shown and described herein an embodiment of my invention comprising a wafer prober having a microscope shiftable between two optical axes, it is to be understood that my invention is not limited to the provision in miniature circuit processing devices of microscopes shiftable between two optical axes. Rather, my invention also embraces miniature circuit processing devices having but one microscope, and that microscope not shiftable, and also miniature circuit processing devices having two or more microscopes.

It is also to be understood that the following claims are intended to cover all of the generic and specific features of my invention hereindescribed, and all statements of the scope of my invention which, as a matter of language, might be said to fall therebetween.

Having described my invention, what I claim as new and desire to secure by Letters Patent is:

1. A miniature circuit processing device, comprising:
    means forming a base plate;
    a chuck disposed beneath said base plate and adapted to hold a silicon wafer or other means having an ordered array of contiguously disposed and regularly spaced indentical miniature circuits to be tested;
    servomechanism means for positioning said chuck with respect to said base plate;
    manual control means for controlling the operation of said servomechanism means;
    first and second alignment means carried by said base plate and defining first and second optical axes which are precisely separated by a distance that is an integer multiple of the center-to-center spacing of said miniature circuits;
    a test head carried by said base plate and disposed above said chuck and including a plurality of elongated conductive test probe means each of which has a first tip portion and a second tip portion, the latter being disposed in a predetermined array arranged about a test head axis located midway between said first and second optical axes and each being adapted to make electrical contact with a predetermined area of a miniature circuit to be tested, and a plurality of elongated test probe guide means including tube means adapted to slideably receive and frictionally engage an associated one of said test probe means and to provide electrical connection therewith; and
    optical means for viewing said miniature circuits along said optical axes, whereby the alignment of one of said optical axes with a particular point on a first miniature circuit and the alignment of the other optical axis with a corresponding point on a second miniature circuit causes said test head axis and said probe means to be aligned in a predetermined manner with a third miniature circuit to be tested.

2. A miniature circuit processing device as recited in claim 1 in which said optical means comprises a single microscope and means for selectively positioning said microscope so that its axis coincides with either one of said first and second optical axes.

3. A miniature circuit processing device as recited in in claim 1 further comprising support means for supporting said test probe guide means in predetermined collocation.

4. A miniature circuit processing device as recited in claim 3 in which said support means include planar insulative means provided with apertures for receiving said test probe guide means.

5. A miniature circuit processing device as recited in claim 4 in which said planar insulative means carry a plurality of conductors each of which is connected to one of the said test probe guide means.

6. A miniature circuit processing device as recited in claim 5, further comprising resilient means for resiliently thrusting said test probe means longitudinally of their associated test probe guide means and into contact with miniature circuit means positioned for processing by said miniature circuit processing device.

7. A miniature circuit processing device as recited in claim 5, further comprising probe tip collocating means for maintaining said second tip portions of said test probe means in predetermined collocation.

8. A miniature circuit processing device as recited in claim 5, further comprising reticle means for use in positioning miniature circuits with respect to said test probe tip collocating means.

9. A miniature processing device as recited in claim 8 in which said reticle means comprises first and second reticle means disposed on opposite sides of said test probe tip collocating means at equal predetermined distances therefrom.

10. A miniature circuit processing device as recited in claim 9, further comprising cable connector means mounted on said planar insulative means and having contact means connected to respective ones of said conductors carried by said planar insulative means.

11. A miniature circuit processing device as recited in claims 4, 7 or 10 wherein each said tube means is an electrically conductive tube telescopically receiving an associated test probe means.

* * * * *